US008778116B2

(12) United States Patent
Morimoto et al.

(10) Patent No.: US 8,778,116 B2
(45) Date of Patent: Jul. 15, 2014

(54) METHOD FOR PRODUCING CARBON NANOTUBE-CONTAINING CONDUCTOR

(75) Inventors: Yoshiyuki Morimoto, Itami (JP); Nobuo Kubosaki, Kameoka (JP); Noriyuki Nakamura, Yamaguchi (JP); Yuzo Sumita, Wakayama (JP)

(73) Assignee: Meijyo Nano Carbon Co., Ltd., Nagoya-Shi (JP)

( * ) Notice: Subject to any disclaimer, the term of this patent is extended or adjusted under 35 U.S.C. 154(b) by 253 days.

(21) Appl. No.: 12/746,679

(22) PCT Filed: Dec. 2, 2008

(86) PCT No.: PCT/JP2008/071839
§ 371 (c)(1),
(2), (4) Date: Jun. 7, 2010

(87) PCT Pub. No.: WO2009/072478
PCT Pub. Date: Jun. 11, 2009

(65) Prior Publication Data
US 2010/0252184 A1    Oct. 7, 2010

(30) Foreign Application Priority Data
Dec. 7, 2007    (JP) .................................. 2007-316965

(51) Int. Cl.
*B44C 1/175*    (2006.01)
(52) U.S. Cl.
USPC .......................... 156/241; 977/842; 977/902
(58) Field of Classification Search
USPC ....................................................... 156/241
See application file for complete search history.

(56) References Cited

U.S. PATENT DOCUMENTS

| 3,875,449 | A | * | 4/1975 | Byler et al. | 313/466 |
| 4,601,849 | A | * | 7/1986 | Yata | 252/500 |
| 5,352,651 | A | * | 10/1994 | Debe et al. | 503/227 |
| 2002/0055057 | A1 | | 5/2002 | Bekku et al. | |
| 2005/0036939 | A1 | * | 2/2005 | Wong et al. | 423/598 |
| 2006/0029537 | A1 | * | 2/2006 | Zhang et al. | 423/447.1 |
| 2006/0115409 | A1 | * | 6/2006 | Li et al. | 423/447.1 |

(Continued)

FOREIGN PATENT DOCUMENTS

| DE | 250389 | A | * | 10/1987 |
| JP | 62-49363 | | | 10/1987 |

(Continued)

OTHER PUBLICATIONS

Kenji Hata, et al., "Water-Assisted Highly Efficient Synthesis of Impurity-Free Single-Walled Carbon Nanotubes", Reports, Science, vol. 306, Nov. 19, 2004, pp. 1362-1364.

*Primary Examiner* — Philip Tucker
*Assistant Examiner* — Vicki Wu
(74) *Attorney, Agent, or Firm* — Oblon, Spivak, McClelland, Maier & Neustadt, L.L.P.

(57) ABSTRACT

A method for producing a carbon nanotube-containing conductor having a conductive layer on the surface of an objective substrate, the method including: pressing a carbon nanotube network layer, via a release substrate having the carbon nanotube network layer thereon, against a transparent objective substrate coated with an electron beam-curable liquid resin composition to infiltrate the liquid resin composition into the carbon nanotube network layer; irradiating it with electron beams to cure the liquid resin composition; and peeling away the release substrate to obtain an objective substrate having a resin composition layer with carbon nanotubes embedded in the surface thereof.

12 Claims, 3 Drawing Sheets

(56) References Cited

U.S. PATENT DOCUMENTS

| | | | |
|---|---|---|---|
| 2006/0167126 A1* | 7/2006 | Goto et al. | 522/81 |
| 2006/0188721 A1* | 8/2006 | Irvin et al. | 428/402 |
| 2006/0204718 A1* | 9/2006 | Kawakami | 428/141 |
| 2006/0286316 A1 | 12/2006 | Iijima et al. | |
| 2007/0298253 A1 | 12/2007 | Hata et al. | |
| 2009/0246400 A1* | 10/2009 | Stevens | 427/532 |

FOREIGN PATENT DOCUMENTS

| | | |
|---|---|---|
| JP | 3-64606 | 10/1991 |
| JP | 5 290633 | 11/1993 |
| JP | 2526782 | 6/1996 |
| JP | 9-115334 | 5/1997 |
| JP | 2000-511245 | 8/2000 |
| JP | 2000 306441 | 11/2000 |
| JP | 3398587 | 2/2003 |
| JP | 2004-2621 | 1/2004 |
| JP | 2004-196912 | 7/2004 |
| JP | 2005-35810 | 2/2005 |
| JP | 2005 78986 | 3/2005 |
| JP | 3665969 | 4/2005 |
| JP | 2005 129406 | 5/2005 |
| JP | 3903159 | 1/2007 |
| JP | 3913208 | 5/2007 |
| WO | 2006 030981 | 3/2006 |

* cited by examiner

METHOD FOR PRODUCING CARBON NANOTUBE-CONTAINING CONDUCTOR

TECHNICAL FIELD

The present invention relates to a method for producing an inexpensive carbon nanotube-containing conductor excellent in conductivity, transparency and durability. More precisely, the invention relates to a method for producing an inexpensive carbon nanotube-containing transparent conductor which combines incompatible properties such as inexpensiveness, high flexibility and durability, high transparency, and high conductivity.

BACKGROUND ART

In flat panel displays such as liquid crystals and organic EL, a high-conductive film having high transparency is much used. At present, the prevailing products are transparent films of polyethylene terephthalate (PET) or the like coated with a conductive metal oxide such as indium tin oxide (ITO) by vapor deposition or sputtering. However, for these ITO sputtered films or ion-plated films, the production equipment must be extremely large-scaled, the size of the products and the producibility are limited, and the products are expensive. What is worse, the obtained coated films are disadvantageous in that they are hard and brittle, and they have a problem of depletion and rise in the price of indium resources. Thinner and more lightweight displays of late require inexpensive, high-transparent and high-conductive films having excellent flexibility and durability.

Recently, in response to the requirements in the industrial field, conductive polymers such as polythiophene and polypyrrole have come to the front as flexible conductive materials. While improvements in conductivity of these conductive polymers and in the film formation technology have been actively pursued, a conductive polymer-containing transparent conductive film that has high conductivity and high transparency comparable to those of an ITO-sputtered film has been proposed in some quarters. However, thickness of the conductive polymer layer is limited due to the color phase peculiar to conductive polymers, and in order to avoid the coloration problem, thickness of the layer must be greatly reduced to 0.2 µm or thinner, resulting in the undeniable lack of strength of the coating film. The conductive polymer has an unsaturated bond derived from the molecular structure thereof, and has the essential drawback of deterioration by UV rays or the like, leading to a serious limitation in practical long-term use as an optical film.

On the other hand, since Nikkiso Co., Ltd. and Hyperion Catalysis International, Inc. each uniquely invented carbon nanofibrils (Patent Documents 1 and 2), a hollow carbon nanomaterial (so-called multi-walled carbon nanotubes) having a single fiber diameter of tens nm, a single fiber length of a few µm and having a crystalline graphite layer as the outermost layer has come to the front as an ultimate carbon fiber material, and development of a resin-hybridized carbon nanotube-containing composite material has been actively promoted. In 1991, Iijima et al in NEC Corporation discovered a cylindrically-formed graphene layer of a so-called single-walled carbon nanomaterial and termed it "carbon nanotube". Since then, members in industry, government and academia who focused on the foreseeable optical and electric properties of these multi-walled and single-walled carbon nanotubes have competed in development of mass-production technology of high-purity multi-walled and single-walled carbon nanotubes and application thereof (Patent Document 3, Non-Patent Document 1).

However, since these carbon nanotubes are produced in aggregate form in which from tens to hundreds ultrafine single fibers are mutually entangled, regardless of whether the single-walled or multi-walled structure, it is extremely difficult to discretely disperse these single fibers in a solvent or a resin. This is one of the major technical obstacles to development of application of carbon nanotubes.

Recently, a method of dispersing these carbon nanotubes in water or in various organic solvents by using a dispersant such as various surfactants or polymers together with a special disperser has been disclosed (for example, Patent Document 4). However, the dispersion extremely easily reaggregates owing to the morphology and the surface property of carbon nanotubes, and is poor in storage stability. For improving the dispersibility of carbon nanotubes themselves, oxidation of the surfaces of carbon nanotube by ozone treatment or strong acid treatment has been proposed. Although this could improve the dispersibility in some degree, reduction in the important conductivity performance is pointed out. Thus, there is not any significant advantage except for special application (for example, Patent Document 5).

Further, when a dispersion liquid comprising carbon nanotubes and a dispersing solvent is directly applied onto an objective substrate, the adhesiveness thereof to the objective substrate is poor, the mechanical strength of the coating film is low, and the film is not practicable. Therefore, in general, a so-called carbon nanotube-containing coating material in which a polymer component such as resin binder is incorporated in a carbon nanotube dispersion is provided. The most widely used resin binder is a thermoplastic resin having excellent transparency, such as vinyl chloride resin and its copolymers, acrylic resin and its modified derivatives, and polyester resin and its modified derivatives (for example, Patent Document 6). For improving the film strength and the durability of thin films, a thermosetting resin such as epoxy resin, silicone resin, and isocyanate-modified urethane resin may be used as the resin binder.

However, since these resin binders and dispersants are generally electrically-insulative, they do not provide surface resistivity as low as expected to a carbon nanotube-containing coating film formed by applying a carbon nanotube-containing coating material onto an objective substrate and drying it thereon. There is an attempt to improve the conductivity of the coating film by increasing the carbon nanotube content thereof, however, surface resistivity of the resulting coating film can only be improved in some degree at the expense of transparency. As to another approach to improve surface resistivity by increasing thickness of the film, thickness of the film has its recognized limit from the viewpoint of transparency. For example, in the case where a carbon nanotube-containing coating film is designed to have a thickness of 0.5 µm and a whole light transmittance of 85%, it is thought that the surface resistivity of the coating film to be obtained is limited to around $10^5$ Ω/square, even though the type, purity, single fiber diameter and the like of the carbon nanotubes are optimized. Accordingly, at present in the market, carbon nanotubes are recognized as transparent antistatic coating materials which are required to have a surface resistivity of from $10^5$ to $10^9$ Ω/square.

Further, a carbon nanotube-containing coating material which comprises a UV-curable binder resin component has been proposed as a so-called carbon nanotube-containing UV-curable coating material (for example, Patent Document 7). The electric properties and the optical properties of the coating film to be obtained are better than those of the above-mentioned carbon nanotube-containing thermoplastic or thermosetting coating materials. However, in fact, the coating film could not satisfy both high transparency (for example, a whole light transmittance of at least 85%) and high conductivity (for example, a surface resistivity of at most $10^5$ Ω/square) required in an optical film and the like, because the UV-curable resin component is naturally electrically-insulative.

Given the current situation, various methods for improving the conductivity of carbon nanotube-containing coating films have been proposed. For example, use of a conductive polymer such as polyaniline and polythiophene as dispersant for carbon nanotubes is reported (for example, Patent Documents 8, 9, and 10). However, this cannot improve the conductivity as much as expected and has the intrinsic drawbacks attributed to conductive polymer as described above, and thereby fails to exhibit a synergistic effect of carbon nanotubes and conductive polymer.

Also hybridization of multi-walled or single-walled carbon nanotubes and conductive metal oxide fine particles has been proposed. However, this still could not exhibit a synergistic effect capable of solving the above-mentioned problems attributed to metal oxide (for example, Patent Document 11).

In a method recently proposed, a high-conductive carbon nanotube-containing coating film is proposed by so-called double-layer coating that comprises first forming a network layer of ultrathin carbon nanotubes and then infiltrating a carbon nanotube-free resin solution into the network layer (Patent Document 12). In another method proposed, carbon nanotubes are dispersively arranged on an objective substrate, then a resin film is formed on the surface of the substrate, and the formed film is separated to obtain an conductive film with carbon nanotubes embedded only in the surface part of the resin film (for example, Patent Document 13). However, these methods are still unsatisfactory for optical use in which both high transparency (for example, a whole light transmittance of at least 85%) and high conductivity (for example, a surface resistivity of less than $10^4$ Ω/square) is indispensable, and films having sufficient strength and durability could not be produced.

In yet another method proposed, a high-conductive carbon nanotube-containing coating film is produced by applying a coating liquid that comprises carbon nanotubes and a binder resin onto an objective substrate to form a conductive layer thereon, wherein the amount of the binder resin is made smaller than the amount of the carbon nanotubes, or a carbon nanotube dispersion is applied onto a release film and dried followed by formation of an adhesive layer to obtain a transfer film which is to be transferred and fixed under pressure onto an objective substrate, thereby making the carbon nanotubes protrude out of the surface of the binder resin layer and making them electrically connected to each other (for example, Patent Document 14). However, the method has practical problems in mechanical strength and durability of the film, because the binder resin layer is too thin.

Patent Document 1: Japanese Patent 1,532,575
Patent Document 2: Japanese Patent 1,701,869
Patent Document 3: Japanese Patent 2,526,782
Patent Document 4: JP-A 2005-35810
Patent Document 5: JP-T 2000-511245
Patent Document 6: Japanese Patent 3,398,587
Patent Document 7: Japanese Patent Application No. 2006-349906
Patent Document 8: Japanese Patent 3,913,208
Patent Document 9: JP-A 2004-2621
Patent Document 10: JP-A 2004-196912
Patent Document 11: JP-A 9-115334
Patent Document 12: Japanese Patent 3,665,969
Patent Document 13: WO2006/030981A1
Patent Document 14: Japanese Patent 3,903,159
Non-Patent Document 1: SCIENCE, 306, p. 1362 (2004)

DISCLOSURE OF THE INVENTION

Problems that the Invention is to Solve

The present invention has been made for solving the above-mentioned problems by using carbon nanotubes as a conductive material, and its object is to provide a method for producing an inexpensive carbon nanotube-containing conductor having high transparency and high conductivity as well as excellent durability.

Means for Solving the Problems

The present inventors have assiduously studied for the purpose of solving the problems and, as a result, found that a conductor extremely excellent in conductivity and durability and having high transparency can be obtained by transferring a carbon nanotube network layer formed on a release substrate onto a transparent objective substrate which is a material to be given conductivity, and then fixing the carbon nanotube layer on the objective substrate using electron beam curing technology for resin such as UV curing. Thus, the present invention has been completed.

Specifically, the present invention includes, as its gist, the following contents:

(1) A method for producing a carbon nanotube-containing conductor that has a conductive layer on the surface of an objective substrate, comprising the steps of:
  pressing a carbon nanotube network layer, via a release substrate having the carbon nanotube network layer thereon, against a transparent objective substrate coated with an electron beam-curable liquid resin composition to infiltrate the liquid resin composition into the carbon nanotube network layer;
  irradiating it with electron beams to cure the liquid resin composition; and
  peeling off the release substrate to obtain a conductor comprising the objective substrate having a resin composition layer with carbon nanotubes embedded in the surface thereof.

(2) The method for producing a carbon nanotube-containing conductor of above (1), wherein the release substrate having the carbon nanotube network layer is obtained by applying a dispersion that contains carbon nanotubes and a dispersion medium and optionally a dispersant, onto the surface of a release substrate and drying it thereon, to form a continuous three-dimensional network layer of carbon nanotubes on the surface thereof.

(3) The method for producing a carbon nanotube-containing conductor of above (1) or (2), wherein the release substrate having the carbon nanotube network layer is obtained by applying a dispersion that contains carbon nanotubes and a dispersion medium and optionally a dispersant, onto the surface of a release substrate and drying it thereon, and then removing the remaining dispersant and other additives by washing with hot water or with the dispersion medium used in the dispersion of carbon nanotubes, to form a continuous three-dimensional network layer of carbon nanotubes on the surface thereof.

(4) The method for producing a carbon nanotube-containing conductor of above (1) or (2), wherein the release substrate having the carbon nanotube network layer is obtained by applying a dispersion that contains carbon nanotubes and a dispersion medium and optionally a dispersant, onto the surface of a release substrate that is made of a heat-resistant material, and drying it thereon, and then removing the remaining dispersant and other additives through thermal decomposition at a temperature of from 400 to 600° C., to form a continuous three-dimensional network layer of carbon nanotubes on the surface thereof.

(5) The method for producing a carbon nanotube-containing conductor of any one of above (1) to (4), wherein the dispersion medium for carbon nanotubes is a polar solvent.

(6) The method for producing a carbon nanotube-containing conductor of any one of above (1) to (5), wherein the objective substrate with carbon nanotubes embedded in the surface of the electron beam-curable resin is washed with water, and further subjected to heating and drying treatment.

(7) The method for producing a carbon nanotube-containing conductor of any one of above (1) to (6), wherein the objective substrate with carbon nanotubes embedded in the surface of the electron beam-curable resin is subjected to impregnation treatment with a dopant, then washed with water followed by heating and drying treatment.

(8) The method for producing a carbon nanotube-containing conductor of any one of above (1) to (7), wherein the electron beam-curable resin composition is a UV-curable resin composition.

(9) The method for producing a carbon nanotube-containing conductor of above (8), wherein the UV-curable resin composition contains a resin having at least two acryloyl groups and a photopolymerization initiator.

(10) The method for producing a carbon nanotube-containing conductor of above (9), wherein the resin having at least two acryloyl groups is a synthetic resin selected from urethane acrylates having at least two acryloyl groups.

(11) The method for producing a carbon nanotube-containing conductor of any one of above (2) to (10), wherein the dispersion containing carbon nanotubes is an aqueous dispersion.

(12) The method for producing a carbon nanotube-containing conductor of any one of above (7) to (11), wherein the impregnation treatment with a dopant is immersion in an aqueous solution of an inorganic acid and/or an organic acid or its salt.

Advantage of the Invention

The method of the present invention makes it possible to obtain a carbon nanotube-containing conductor, in which a continuous three-dimensional network layer of carbon nanotubes is embedded and fixed in the extreme vicinity of the surface of an electron beam-curable resin layer provided on the surface of a transparent objective substrate that is a material to be given conductivity. According to the present invention, carbon nanotubes can be fixed in such a state that a continuous three-dimensional network layer thereof is embedded in the extreme vicinity of the surface of the electron beam-curable resin layer, without the binder resin or the like which does not always have a high conductivity adhering to or covering the surface of the individual carbon nanotube fibers. Accordingly, as compared with a conventional method such as coating with a carbon nanotube-containing coating material, the method of the present invention ensures extremely excellent conductivity. In addition, it provides a conductor extremely excellent in durability and film strength due to the structure where carbon nanotubes are embedded in a resin layer cured by electron beams such as UV rays.

Further, the thus-formed carbon nanotube-containing electron beam-curable resin layer has good light transmittance, and therefore, when a highly transparent one is used as the objective substrate, a conductor extremely excellent in transparency, especially a conductive transparent thin film can be obtained. Accordingly, in the objective substrate having an electron beam-curable resin layer containing a carbon nanotube network layer, which is obtained according to the method of the present invention, decrease in whole light transmittance relative to that of a non-processed one may remain at 10% or less, and a haze may be at most 1.0%.

BEST MODE FOR CARRYING OUT THE INVENTION

Hereinafter, the method for producing a carbon nanotube-containing conductor of the present invention is described in further detail.

The present invention is a method for obtaining a conductor with a continuous three-dimensional network layer of carbon nanotubes formed on the surface of a resin composition layer on a transparent objective substrate, which comprises forming a continuous three-dimensional network layer of carbon nanotubes on a predetermined substrate (release substrate) according to a method of applying a dispersion in which carbon nanotubes previously dispersed onto the substrate, while applying an electron beam-curable liquid resin composition onto the surface of a transparent material (objective substrate) to be given conductivity, and then pressing the network layer of carbon nanotubes formed on the release substrate against the objective substrate to infiltrate the electron beam-curable liquid resin composition into the network layer of carbon nanotubes, irradiating it with electron beams to cure the electron beam-curable liquid resin composition, and thereafter peeling the release substrate away from the objective substrate having the carbon nanotube-embedded resin composition layer on the surface thereof to transfer the carbon nanotube network layer onto the surface.

According to the conductor production method of the present invention, the carbon nanotube fibers forms the network layer while they are in direct contact with each other, and the network layer is directly transferred onto the objective substrate and fixed thereon, as already described above. Thus, there is little binder resin and the like that adheres in the carbon nanotube fibers or covers the fibers, and accordingly, there is little decline in conductivity between the carbon nanotubes. In addition, since the carbon nanotubes exist only in the extreme vicinity of the electron beam-curable resin composition layer on the objective substrate, the conductor obtained can have extremely excellent conductivity. Further, since the resin composition layer is cured with electron beams such as UV rays, the carbon nanotubes can be firmly fixed on the objective substrate to provide excellent scratch resistance and durability.

The carbon nanotube for use in the present invention may be any of single-walled carbon nanotubes and/or multi-walled carbon nanotubes, or any of single-walled carbon nanotubes and/or multi-walled carbon nanotubes of which the surfaces are physically or chemically treated, or any of their mixtures. In order to obtain a carbon nanotube-containing coating layer which can satisfy both transparency and conductivity, the single-walled and/or multi-walled carbon nanotubes have a diameter of carbon nanotube single fiber preferably from 0.5 nm to 50 mm, and more preferably from 0.5 nm to 10 nm. The length of the single fibers is preferably from 0.1 µm to 100 µm, more preferably from 0.1 to 10 µm. The aspect ratio of the carbon nanotubes is preferably from 50 to 100000, more preferably from 100 to 50000.

Single-walled and/or multi-walled carbon nanotubes are produced generally in the form of so-called fiber aggregates, which consists of from tens to hundreds single fibers mutually entangled. The size of the aggregate is generally from hundreds µm to a few mm. Single-walled or several-walled ultrathin carbon nanotubes, of which the diameter of single fiber is at most 5 nm, are produced in a mode of double aggregation, where the single fibers aggregate into bundles through electrical attraction between them, and these bundles are mutually entangled with each other to form an aggregate. At present, these single-walled and/or multi-walled carbon nanotubes are available on the market. For example, "NC-7000" and "NC-1101" produced by Nanocyl, "$C_{tube}$1000" by CNT, "Baytubes C150P" by Bayer, "L.SWNTs" by Shenzhen Nanotech Port, "SWNT FH-P" by Meijyo Nano Carbon, "SW-CNT" by Carbolex, "Super-growth Method SW-CNT" and "DIPS method SW-CNT" by Advanced Industrial Science and Technology, and the like are available.

In the method of the present invention, a dispersion of carbon nanotubes dispersed in a dispersion medium is first prepared. The method of dispersing carbon nanotubes in a dispersion medium is not particularly limited. For example, carbon nanotubes are added to a dispersion medium and dispersed therein, for example, with a disperser capable of applying strong shear force such as ultrasonic disperser, homogenizer and bead mill. In this case, carbon nanotubes may be dispersed in the absence of a dispersant, but in general, a dispersant is preferably used in order to prepare a stable dispersion. The concentration of carbon nanotubes in the dispersion is not particularly limited, but is preferably from 0.001% to 1.0%.

As the dispersion medium in which carbon nanotubes are dispersed, water may be used. In addition, polar solvents such as ethanol, isopropyl alcohol, diacetone alcohol, methyl ethyl ketone, cyclohexane, butyl acetate, and ethyl acetate, and nonpolar solvents such as toluene and xylene may also be used. Of those, water or isopropyl alcohol is most preferred because the stability of the resulting dispersion is excellent when carbon nanotubes are dispersed therein.

The dispersant is not particularly limited as long as it dissolves in the dispersion medium and disperses carbon nanotubes therein, and any one conventionally used in dispersing carbon nanotubes is usable. Specific examples include various surfactants, polymer-type activators, and polymers. These dispersants may be used either singly or as a combined system.

Specifically, when water is used as the dispersion medium, naphthalenesulfonic acid/formalin condensate and its salts, alkylbenzenesulfonic acid and its salts and the like may be used. When the dispersion medium is a polar solvent such as isopropyl alcohol, amine-modified acrylic copolymers, polyester acid amidamine salts, amine-modified polyesters and the like may be used. When the dispersion medium is a nonpolar solvent such as toluene, polyether phosphate amine salts and the like may be used.

When ultrathin carbon nanotubes having the single fiber diameter of at most 5 nm which form bundles as described in above is used, water is preferably used as the dispersion medium and an aqueous dispersant is preferably used, in order to effectively utilize the electric repulsion in the dispersion process. More preferably, water is used as the dispersion medium and an anionic, cationic or nonionic water-soluble surfactant or polymer-type activator is used as the dispersant.

The release substrate for use in the present invention is not particularly limited as long as it has a flat and smooth surface, and any one can be used regardless of whether it is transparent or opaque. "Release" as referred to herein means that the release substrate and the electron beam-curable liquid resin coating film do not firmly adhere to each other and could be readily peeled away from each other. Any substrate having a flat and smooth surface, releasability and suitable strength may be used as release substrate. Specific examples include thermoplastic resin substrates of polyolefin resin such as polyethylene and polypropylene; polyvinyl resin such as polystyrene, polyvinyl chloride, and polyvinyl alcohol; polyacrylic resin such as polymethyl methacrylate; polyester resin such as polyethylene terephthalate and polycarbonate; nylon resin such as nylon 6 and nylon 66, and the like; thermosetting resin substrates of unsaturated polyester resin, polyurethane resin, epoxy resin, polysilicone resin, polyimide resin and the like, or their modified resin; ceramic substrates such as glass, silicon, and alumina; metal substrates, and the like.

In consideration of the later process of electron beam irradiation with UV ray or the like, the release substrate is preferably an inexpensive and highly-transparent resin substrate of polypropylene, polyethylene terephthalate or the like. For improving the above-mentioned releasability thereof, the release substrate may be surface-treated with a silicone-base, fluorine-containing, or long chain alkyl group-having release agent and the like.

Thus prepared dispersion of carbon nanotubes is applied onto the release substrate. The method for applying dispersion is not particularly limited and any ordinary method used in coating with a coating material or the like may be employed. Examples of the method include bar coating, gravure coating, spin coating, spraying, dipping, roll coating, knife edge coating, screen printing, inkjet printing and the like.

The coating amount of carbon nanotubes may be from $1 \times 10^{-4}$ to $1 \times 10^{-1}$ g/m², and they are applied onto the release substrate so as to be uniform on the entire surface thereof. The frequency of applying to the release substrate is not also limited. A carbon nanotube-containing dispersion having a relatively high carbon nanotube concentration of 0.2% or more may be applied and dried; or a carbon nanotube-containing dispersion having a lower carbon nanotube concentration may be applied and dried more than once. It is preferred that a carbon nanotube-containing dispersion having a lower concentration of 0.1% or less is applied and dried more than once in order to form a carbon nanotube network layer having a higher uniformity.

The release substrate thus coated with a carbon nanotube-containing dispersion is once dried so as to evaporate away the dispersion medium such as water, and thereby a continuous three-dimensional network layer of carbon nanotubes is formed on the release substrate. The method of drying the carbon nanotube-containing dispersion is not particularly limited, and any ordinary hot air drying, reduced pressure drying or the like may be employed.

"Continuous" of the continuous three-dimensional network layer of carbon nanotubes as referred to herein means that carbon nanotube single fibers as combined together or fine bundles of several carbon nanotube single fibers as aggregated together are in contact with each other or are adjacent to each other to form high-conductive paths on the entire surface of the release substrate.

It is preferred that the release substrate coated with the dispersion is dried and then washed by immersing it in water or in the other solvent used in preparing the carbon nanotube dispersion, in order to remove the dispersant and other additives remaining in the carbon nanotube-containing dispersion. In this way, the dispersant and other additives remaining on the release substrate are removed, and a continuous three-dimensional network layer of carbon nanotubes is thereby formed on the substrate.

In order that the final product, carbon nanotube-containing conductor can have especially excellent conductivity, it is important to remove as completely as possible the dispersant and other additives adhering to the continuous three-dimensional network layer of carbon nanotubes. Specifically, washing with hot water at around 50 to 80° C. or with a solvent heated at around 50 to 80° C. is preferable to mere washing with water or a room-temperature solvent used for the dispersion. Further, depending on the type of the dispersant, washing with an alkaline aqueous solution or an acidic aqueous solution may be preferable to water.

Further, when complete removal of the dispersant and other additive is difficult, decomposing the organic ingredients of the dispersant and other additives by heating may be effective. Preferably, the coated release substrate is heated at a temperature at which the organic ingredients of the dispersant and other additives can burn whereas the carbon nanotubes does not burn, to obtain a carbon nanotube network layer which consists of carbon nanotubes alone adhering to the release substrate. In this case, for example, a carbon nanotube dispersion is applied onto a release substrate of glass plate or ceramic plate which is excellent in heat resistance, and dried to remove the solvent, and then this is further heated at 400 to 600° C., preferably at 450 to 500° C. for 10 to 30 minutes to decompose and remove the organic ingredients of the dispersant and other additives.

On the other hand, a liquid resin composition curable through irradiation with electron beams such as UV rays is applied on the surface of a material to be given conductivity (objective substrate). The objective substrate is not particularly limited as long as it has a flat and smooth surface and high transparency, and thermoplastic resins, thermosetting resins, elastomers, ceramics, composite materials and the like may be used.

Examples of the thermoplastic resin substrate used as the objective substrate include polyolefin resins such as polyethylene, polypropylene, and polycycloolefin; polyvinyl resins such as polystyrene, polyvinyl chloride, and polyvinyl alcohol; polyacrylic resins such as polymethyl methacrylate; polyester resins such as polyethylene terephthalate, polybutylene terephthalate, polylactic acid, and polycarbonate; nylon resins such as nylon 6, and nylon 66; superengineering resins such as polyphenylene ether, polyphenylene sulfide, polyether imide, and polyether sulfone; cellulose resins such as triacetyl cellulose; and their modified resins and the like.

Examples of the thermosetting resin substrate used as the objective substrate include unsaturated polyester resins, crosslinked polyurethane resins, epoxy resins, polysilicone resins, polyimide resins and their modified resins and the like. Examples of the elastomer substrate used as the objective substrate include natural rubber; synthetic rubbers such as SER, SBS, and silicone rubber; polyurethane resins and the like. Examples of the ceramic substrate used as the objective substrate includes glass and the like.

Of those, resin materials which are excellent in transparency such as polyvinyl chloride, polycycloolefin, polyacrylic resin, polyethylene terephthalate, polycarbonate, and triacetyl cellulose are preferred from the viewpoint of the light weight, the toughness and the transparency thereof. Depending on the intended use thereof, the objective substrate may have any shape such as sheet, film, block, or shape of various resin articles.

The electron beam-curable liquid resin composition for use in the present invention is a resin composition containing an electron beam-curable resin as the indispensable component, and when the composition is a UV-curable resin composition, it further contains a polymerization initiator as the indispensable component. As necessary, the composition may contain a solvent, a leveling agent, a slip agent, a defoaming agent, a silane coupling agent, a photosensitizer, a UV absorbent, a light stabilizer, a thickener, and a colloidal silica.

The electron beam-curable liquid resin is not particularly limited as long as it is cured by electron beams such as UV rays and can be used in a coating material, but should be selected in consideration of the intended use and the necessary properties thereof.

Examples of the electron beam-curable liquid resin for use in the electron beam-curable liquid resin composition include polymers having the same chemical structure as that of the UV-curable liquid resins mentioned below.

Examples of the UV-curable liquid resins that are cured by UV rays include acrylate resins having at least two acryloyl groups such as UV-curable monomers or oligomers having at least two acryloyl groups, and photocurable monomers or oligomers having at least two acryloyl groups.

The number of the acryloyl groups in one molecule of the UV-curable resin is preferably from 2 to 6, and specific examples include 1,6-hexanediol diacrylate, PO-modified neopentyl glycol diacrylate, bisphenol A diacrylate, tricyclodecane-dimethanol diacrylate, pentaerythritol triacrylate, trimethylolpropane triacrylate, trimethylolpropane ethoxytriacrylate, glycerin propoxytriacrylate, dipentaerythritol hexaacrylate, pentaerythritol ethoxytetraacrylate, ditrimethylolpropane tetraacrylate, polyether acrylate, polyurethane acrylate, epoxyacrylate, polyester acrylate; and their amine-modified, fatty acid-modified, silicone-modified, or lactone-modified derivatives and the like.

Polyether acrylate has a structure in which at least two acryloyl groups are introduced into a polyether molecule.

Specific examples include dipropylene glycol diacrylate, tripropylene glycol diacrylate, PEG-600 diacrylate, PEG-400 diacrylate and the like.

Polyurethane acrylate has a structure in which at least two acryloyl groups are introduced into a polyurethane molecule. As commercial products, Beamset 575 (produced by Arakawa Chemical Industry), Beamset 577 (produced by Arakawa Chemical Industry), EBECRYL 1290K (produced by Daicel Cytec) and the like are available.

Polyester acrylate has a structure in which at least two acryloyl groups are introduced into a polyester molecule. As commercial products, Aronix M-7100 (produced by To a Gosei), EBECRYL 436 (produced by Daicel Cytec) and the like are available.

Epoxyacrylate has a structure in which at least two acryloyl groups are introduced into an epoxy resin. As commercial products, EBECRYL 3703 (produced by Daicel Cytec) and the like are available.

Silicone-modified acrylate has a structure formed by modifying a part of the molecular structure of an acrylate polymer with an organopolysiloxane. As commercial products, EBECRYL 1360 (produced by Daicel Cytec) and the like are available.

The UV-curable resin for use in the present invention generally has a weight-average molecular weight of from 100 to 30000, preferably from 200 to 10000. When the molecular weight is too low, dryability of the resin may be poor, and the resin may evaporate away like the solvent in drying. However, when the molecular weight is too high, viscosity may become impracticable, and crosslinking density of the coating film after curing may lower and thereby failing to attain the desired durability. The weight-average molecular weight is measured according to a GPC method.

The UV-curable resin for use in the present invention may be combined with, as any other component, a monofunctional UV-curable resin, for attaining better coating film properties and surface texture and in consideration of the coating workability and the cure shrinkage. A monofunctional UV-curable resin that dissolves the above-mentioned polyfunctional UV-curable resin is preferably used. Examples of the monofunctional UV-curable resin include β-carboxyethyl acrylate, isobornyl acrylate, cetyl acrylate, ethoxylated phenyl acrylate, aliphatic epoxy acrylate, ethoxylated acrylate and the like.

A polyurethane acrylate is preferably used as the UV-curable resin in the present invention from the viewpoint of the hardness, the adhesiveness to the substrate, and the flexibility thereof when the objective substrate is a plastic such as PET, acryl, polyvinyl chloride, and polycarbonate.

The polymerization initiator for use in the UV-curable resin composition is one that initiates polymerization and curing through irradiation with UV rays. Specific examples include 2,2-dimethoxy-1,2-diphenylethan-1-one, 1-hydroxycyclohexyl phenyl ketone, 2-hydroxy-2-methyl-1-phenylpropan-1-one, benzophenone, 1-[4-(2-hydroxyethoxy)phenyl]-2-hydroxy-2-methyl-1-propan-1-one, hydroxy-1{4-[4-(2-hydroxy-2-methyl-propionyl)-benzyl]-phenyl}-2-methylpropan-1-one, 2-(2-oxo-2-phenyl-acetoxyethoxy)-ethyl oxyphenylacetate, 2-(2-hydroxyethoxy)ethyl oxyphenylacetate, 2-methyl-1-[4-(methylthio)phenyl]-2-morpholinopropan-1-one, 2-benzyl-2-dimethylamino-1-(4-morpholinophenyl)butanone-1, 2-dimethylamino-2-(4-methylbenzyl)-1-(4-morpholin-4-ylphenyl)-butan-1-one, bis(2,4,6-trimethylbenzoin)phenylphosphine oxide, 2,4,6-trimethylbenzoin-diphenylphosphine oxide, bis(2,6-dimethoxybenzoyl)-2,4,4-trimethyl-pentylphosphine oxide, bis(η5-2,4-cyclopentadien-1-yl)-bis[2,6-difluoro-3-(1H-pyrrol -1-yl)phenyl]titanium 1,2-octanedione, 1-[4-(phenylthio)-2-(O-benzoyloxime)]ethanone, 1-[9-ethyl-6-(2-methylbenzoyl)-9H-carbazol-3-yl]-1(O-acetylox ime) and the like. 2-(2-oxo-2-phenylacetoxyethoxy)ethyl oxyphenylacetate, 2-(2-hydroxyethoxy)ethyl oxyphenylactate, and 1-hydroxycyclohexyl phenyl ketone are particularly preferred from the viewpoint of the curing property and the price.

The amount of the polymerization initiator is not particularly limited as long as it secures the polymerization and curing of the UV-curable resin, and is generally from 1 to 20 parts by weight relative to 100 parts by weight of the UV-curable resin, preferably from 3 to 10 parts by weight.

The solvent for the UV-curable resin is not particularly limited as long as it dissolves the UV-curable resin. Preferred examples of the organic solvent include ketone solvents such as methyl ethyl ketone and cyclohexanone; alcohol solvents such as ethanol and isopropyl alcohol; ester solvents such as ethyl acetate, isopropyl acetate, butyl acetate, methyl propionate, ethyl propionate, and ethylene glycol monoacetate; ether solvents such as 2-methoxyethanol, 2-ethoxyethanol, 1-methoxy-2-propanol, and 1-ethoxy-2-propanol; aromatic solvents such as toluene and xylene, and the like. These solvents may be used singly or in mixture.

On the objective substrate coated with the electron beam-curable liquid resin composition, the above-mentioned release substrate with the continuous three-dimensional network layer of carbon nanotubes formed thereon is laid carefully so that any bubbles do not intrude therebetween or the two are not deformed; and the two are pressed under a load of from 300 g to 2000 g or so, for example, by pulling a paddle laterally, or by using a pressure roller, to press the carbon nanotube network layer formed on the release substrate against the objective substrate. By pressing for 1 minute to 5 minutes or so, the liquid resin composition penetrates and is thus infiltrated into the carbon nanotube network layer. In this step, by the pressure of the paddle or the roller, a part of the electron beam-curable liquid resin composition may be extruded out of the system.

In this case, the liquid resin composition must be adequately infiltrated into the carbon nanotube network layer under pressure. It seems that viscosity and surface tension of the liquid resin composition would have significant influences on the infiltration, but in fact, there is little influence of the surface tension change, and the viscosity change does not also have any significant influence. The liquid resin composition thus can be well infiltrated under pressure into carbon nanotubes in a considerably broad viscosity range. In addition, the setting time in pressing and infiltration of the liquid resin composition into the carbon nanotube network layer, and also the ambient temperature and humidity in the production process did not have any significant influence on the properties of the conductor obtained finally.

In this way, the carbon nanotube network layer on the release substrate is pressed against the electron beam-curable liquid resin composition on the objective substrate, and the objective substrate is irradiated with electron beams to cure the liquid resin composition. The electron beams to be irradiated may be low-energy electron beams or UV rays, and most preferably UV rays having a wavelength of from 200 to 3000 nm.

The electron beams irradiation may be suitably controlled in accordance with the type and the amount of the liquid resin composition to achieve the cumulative dose necessary to fully cure the liquid resin composition.

For example, the cumulative dose in electron beam radiation may be generally 50 kGy at 150 kV; and the cumulative dose in UV radiation may be generally from 300 to 1200 mJ/cm$^2$ or so.

Next, the release substrate is peeled away from the objective substrate against which the release substrate has been pressed and on which the electron beam-curable resin composition infiltrated into the carbon nanotube layer has been cured. The objective substrate with the carbon nanotube network embedded in the vicinity of the surface of the cured resin composition layer is thus obtained.

There is a possibility that a slight amount of dispersant, leveling agent and other additives in the dispersion, uncured resin component, solvent and others may still remain in the carbon nanotube network on the surface of the objective substrate from which the release substrate has just been peeled off. Therefore, it is preferred that the surface is washed with a liquid such as water, alcohol or the like which does not have an adverse affect on the cured resin layer, and then dried. In this way, the carbon nanotube-containing conductor of the present invention can be obtained.

The thus-obtained carbon nanotube-containing conductor is preferably doped for further improving the conductivity thereof. The doping treatment means modification of the fibrous surface of the carbon nanotubes by immersing the objective substrate having the carbon nanotube network layer on the surface thereof, in a solution of dopant. Specifically, an aqueous solution of a strong acid such as hydrochloric acid, nitric acid, and sulfuric acid, or aqueous hydrogen peroxide or the like is used as the dopant, and the carbon nanotube-containing conductor is immersed in the aqueous solution for a predetermined period of time. The immersion time is generally from 3 minutes to 10 minutes, although it may vary depending on the type and the concentration of the dopant and the effect maybe seen by immersion for tens of seconds to tens of minutes. After the immersion treatment, the liquid is wiped away followed by drying at a temperature of around 100° C.

The method of the present invention is described in more detail with reference to drawings.

FIG. 1 to FIG. 5 show a series of steps in the production process for a carbon nanotube-containing conductor according to the transfer method of the present invention.

First, as shown in FIG. 1, a carbon nanotube dispersion is applied onto a release substrate 1. When the dispersion contains a dispersant 3 and a leveling agent 4, the dispersant 3 and the leveling agent 4 adhere to the carbon nanotubes 2.

Next, as shown in FIG. 2, the release substrate 1 coated with the carbon nanotube dispersion is washed and dried to obtain the release substrate 1 on which a carbon nanotube network layer 2 is formed. When the dispersion contains a dispersant 3 and a leveling agent 4, the dispersant 3 and the leveling agent 4 adhering to the carbon nanotubes 2 are washed away.

Next, as shown in FIG. 3, an electron beam-curable resin composition 6 is applied onto an objective substrate 5, and the side of the carbon nanotube network layer 2 of the release substrate 1 is laid on the electron beam-curable resin composition 6, and then pressed from above. In FIG. 3, one end of the release substrate 1 is put on the objective substrate 5, and then the release substrate 1 is pressed against the electron beam-curable resin composition 6 of the objective substrate 5 by pressing a paddle 7 from above under a load of around 1000 g and moving the paddle 7 in the direction of the arrow with avoiding air bubbles between the two, and thereby the electron beam-curable resin composition 6 is infiltrated into the carbon nanotube network layer 2.

Then, as shown in FIG. 4, the objective substrate 5 to which the release substrate 1 has been bonded under pressure is irradiated with electron beams 8 to cure the electron beam-curable resin composition 6. After the resin is cured, the release substrate 1 is peeled off. Thus, as shown in FIG. 5, the carbon nanotube network layer 2 is transferred onto the objective substrate 5, and thereby giving a conductor of the present invention in which the carbon nanotube network layer 2 is fixed in the extreme vicinity of the surface of the electron beam-curable resin composition 6 applied to the surface of the objective substrate 5.

The present invention is described further with reference to the following Examples; however, the invention should not be limited to these Examples. Unless otherwise specifically indicated, "part" and "%" are by mass.

The conductors having a carbon nanotube-containing resin coating layer, as obtained in the following Examples, were evaluated according to the method mentioned below.

(a) Surface Resistance:

The surface resistance is an electric resistance per unit surface area (Ω/square) of the coating film. In this description, the surface resistance of $1\times10^6$ Ω/square or more was measured with Hirester UP (produced by Mitsubishi Chemical); and the surface resistance of less than $1\times10^6$ Ω/square was measured with Lorester (produced by Mitsubishi Chemical).

(b) Whole Light Transmittance:

The whole light transmittance is a proportion (%) of the transmitted light to the incident light to the coating film, and is a proportion of the transmitted light including scattered light. This is measured with an apparatus using an integrating sphere according to JIS K 7361. In this description, the whole light transmittance (%) was measured with a haze meter NDH 2000 (produced by Nippon Denshoku Industries). In the Tables in Examples given below, the whole light transmittance is a value obtained by analyzing the objective substrate with a carbon nanotube-containing resin coating layer formed thereon.

(c) Haze:

The haze is an index of the degree of ambiguous cloudy appearance of the inside or the surface of the transparent film, and is represented by the proportion of the scattered light to the transmitted light including the scattered light. This is measured with an apparatus using an integrating sphere according to JIS K 7136. In this description, the haze was measured with a haze meter NDH 2000 (produced by Nippon Denshoku Industries), as the whole light transmittance was.

(d) Pencil Hardness:

The pencil hardness was determined according to the "pencil scratch test" of JIS K 5600-5-4. Specifically, using a pencil having a lead hardness of from 6B to 9H, the sample surface was scratched at an angle of 45 degrees under a load of 750±10 g applied thereto. The hardness of the hardest pencil that gave no scratch mark on the sample surface is the pencil hardness of the sample.

(e) Adhesiveness:

The adhesiveness was determined according to JIS K 5600-5-6 "Adhesiveness" (cross-cut method: 10×10 cross-cuts of 1 mm×1 mm each). Specifically, the carbon nanotube-containing resin coating layer was cut with a cutter to make 10 rows and 10 columns at 1 mm intervals, thereby forming a 100-square grid. A tape was pressed against the grid, and then peeled away within 5 minutes. The remaining condition of the coating film on the grid was visually checked. The test results were grouped according to the "Grouping of Table 1 Test Result" of the JIS.

(f) Durability (Rub Resistance):

The durability of the coating film was evaluated according to the following rub resistance test.

Specifically, a white cotton fabric for friction was fitted to a color fastness friction tester FR-2 (produced by Suga Test Instruments), and a friction test of 100 laps was conducted for the coating film. After the test, the surface resistance value, the whole light transmittance, and the haze of the film were measured, and the outward appearance thereof was checked. The whole light transmittance and the haze were measured in the same manner as in the above (a) to (c), and the outward appearance was evaluated in the manner mentioned below.

●Coating Film Appearance Evaluation:

The scratches, if any, on the surface of the coating film were visually checked and evaluated as follows:

○: No scratch found on the surface.

Δ: Scratches found on the surface, but not reached the objective substrate.

x : Scratches on the surface reached the objective substrate.

(g) Condition of Coating Film after Transfer:

The condition of the coating film after transfer was evaluated by visually checking the outward appearance of the coating film after its formation according to the following evaluation standards:

○: The coating film was transferred successfully without transfer defect of the carbon nanotubes resulting from curing failure of the UV-curable resin or from contamination with air bubbles in transferring.

x: The coating film had transfer defects of the carbon nanotubes resulting from curing failure of the UV-curable resin or from contamination with air bubbles in transferring.

EXAMPLE 1

(1) Formation of Release Substrate Having Carbon Network Layer:

0.10 parts of SWNT FH-P (mean diameter: 2 to 3 nm, aspect ratio: 1000 to 5000, produced by Meijyo Nano Carbon) as single-walled carbon nanotubes and 0.60 parts of sodium alkylbenzenesulfonate (trade name: Neopelex G-65, produced by Kao) as a dispersant were added to 99.30 parts of water, and the mixture was dispersed using an ultrasonic disperser (trade name: UH 600, produced by SMT) set at an output power of 7, at a cooling water temperature of 10° C. The dispersion time was about 30 minutes when the mixture amount was 100 g. Next, 0.50 parts of polyether-modified polydimethylsiloxane (trade name: BYK 348, Produced by BYK Chemie) as a leveling agent was added to the ultrasonicated dispersion with stirring to prepare a dispersion for carbon nanotube network layer formation.

Subsequently, the dispersion for carbon nanotube network formation was applied onto a release substrate, UV-transmissive untreated PET film (produced by Toyobo) using a bar coater, so that the coating amount of the carbon nanotubes thereon could be $11.5 \times 10^{-3}$ g/m$^2$, and then dried at 130° C. for 1 minute, thereby forming a carbon nanotube network layer on the release substrate. Next, this was immersed in water for 5 minutes to remove the dispersant Neopelex G-65 and the leveling agent BYK 348 remaining in the carbon nanotube network layer, then pulled up from water and left at room temperature for 5 minutes to drain off the water, and then further dried at 130° C. for 1 minute to obtain a PET film having a carbon nanotube network layer on the surface thereof. This was left in a thermo-hygrostat at a temperature of 20° C. and a humidity of 50% for 30 minutes to obtain a release substrate of a PET film having a carbon nanotube network layer on the surface thereof.

(2) Preparation of Objective Substrate Having UV-curable Resin Composition:

The components shown in Table 1 were added in order, and stirred and mixed until evenly combined, thereby giving a UV-curable liquid resin composition. The UV-curable liquid resin composition in a hermetically sealed state was stored in a thermo-hygrostat for 3 hours, in which the liquid temperature was controlled to be 20° C. The viscosity of the liquid resin composition was 9 (mPa·s), and the surface tension thereof was 29.9 (mN/m).

Subsequently, the UV-curable resin composition was applied onto an objective substrate, transparent acryl plate (whole light transmittance: 92.5%, produced by Kuraray) using a bar coater to have a wet thickness of 60 µm thereon, thereby giving an acryl plate having a UV-curable resin composition layer.

TABLE 1

| Additive Component | part by mass |
|---|---|
| Urethane acrylate | 46.00 |
| (number of acryloyl groups in one molecule: 3 to 6, weight-average molecular weight: 1000, trade name: Beamset 577, produced by Arakawa Chemical Industries) | |
| Ethoxylated phenyl acrylate | 20.00 |
| (number of acryloyl groups in one molecule: 1, trade name: EBECRYL 114, produced by Daicel Cytec) | |

TABLE 1-continued

| Additive Component | part by mass |
|---|---|
| Photopolymerization initiator | 5.00 |
| (trade name: IRGACURE 754, produced by Ciba Specialty Chemicals) | |
| Ethyl acetate | 29.00 |
| Total | 100.00 |

(3) Formation of Objective Substrate Having Carbon Nanotube-containing Resin Layer:

One end of the carbon nanotube network layer formed on the surface of the release substrate of PET film as prepared in the above (1) was placed in contact with the UV-curable liquid resin composition layer of the objective substrate of acryl plate as prepared in the above (2). At the contact portion, a paddle was pressed against the surface (uncoated surface) of the release substrate opposite to the PET film having the carbon nanotube network layer under a load of about 1000 g, and moved to the other end of the opposite side under the load to avoid making air bubbles in the contact area between the carbon nanotube network layer and the UV-curable resin composition layer as much as possible, thereby the UV-curable resin composition was infiltrated into the carbon nanotube network layer under pressure.

After the pressure infiltration, UV irradiation was conducted onto the PET film surface of the release substrate at the cumulative UV dose of 300 mJ/cm$^2$ using a UV exposure machine (ECS-151U, produced by Eye Graphics) to cure the UV-curable liquid resin composition. Subsequently, the PET film of release substrate was peeled away to obtain an objective substrate having a carbon nanotube-containing resin coating layer. In this way, an objective substrate having a carbon nanotube-containing resin layer in which the carbon nanotube network layer was embedded and fixed in the vicinity of the surface of the resin layer was obtained by pressing the carbon nanotube network layer of the release substrate against the UV-curable liquid resin composition applied on the objective substrate, infiltrating the resin into the carbon nanotube network layer, curing it with UV rays, and transferring the carbon nanotube network layer onto the objective substrate.

Further, after removal of the PET film of release substrate, UV irradiation was conducted onto the surface of the carbon nanotube-containing resin layer of the objective substrate at the cumulative UV dose of 300 mJ/cm$^2$ using the same UV exposure machine as above, to obtain the objective substrate having a carbon nanotube-containing resin coating layer.

Table 2 shows the physical data of the thus obtained objective substrate and that after rub resistance test. Before coated with the resin, the acryl plate had a whole light transmittance of 92.5%, a haze of 0.1 and a pencil hardness of 3 H.

TABLE 2

| | Evaluation Result in Experiment 1 | |
|---|---|---|
| Evaluation Item | Before rub resistance test | After rub resistance test |
| CNT coating amount (g/m$^2$) | $11.5 \times 10^{-3}$ | $11.5 \times 10^{-3}$ |
| Surface resistivity (Ω/square) | $2.3 \times 10^4$ | $6.1 \times 10^4$ |
| Whole light transmittance (%) | 87.4 | 87.5 |
| Haze | 0.4 | 0.4 |
| Pencil hardness | 5H | 5H |
| Adhesiveness | class 0 | class 0 |
| Appearance of coating film | ○ | ○ |

As will be noted from the results, the conductor of an acryl plate having the carbon nanotube network layer on the surface of the resin coating layer thereof produced according to the method of the present invention is excellent in conductivity of $2.3 \times 10^4$ (Ω/square), and in light transmittance of 87.4% as compared with the whole light transmittance of the acryl plate of 92.5%. After the rub resistance test, the surface resistivity decreased only slightly, the transparency showed little change, and the outward appearance of the coating film remained in good condition. Thus, that the objective substrate having the carbon nanotube-containing resin coating layer is found to be excellent in rub resistance and in durability.

EXAMPLE 2

Physical Data Comparison in Change of Carbon Nanotube (CNT) Coating Amount:

Objective substrates having a carbon nanotube-containing resin coating layer were produced under the same condition and according to the same operation method as in Example 1, except that the carbon nanotube coating amount was changed as shown in Table 3.

The CNT coating amount was a computed amount obtained according to the following formula:
Wet thickness with bar coater: Tw (μm)
Density of dispersion for carbon nanotube network layer formation:
G (g/cm$^3$)
CNT concentration in dispersion for carbon nanotube network layer formation: C %

Table 3 also shows the physical data of these objective substrates which were evaluated in the same manner as in Example 1.
[Formula 1]
  CNT coating amount (g/m$^2$)=(Tw×G×C)/100

TABLE 3

|  | Experiment 2 | Experiment 3 | Experiment 4 | Experiment 5 |
| --- | --- | --- | --- | --- |
| CNT coating amount (g/m$^2$) | $6.9 \times 10^{-3}$ | $9.2 \times 10^{-3}$ | $23.0 \times 10^{-3}$ | $34.5 \times 10^{-3}$ |
| Surface resistivity (Ω/square) | $2.3 \times 10^5$ | $7.8 \times 10^4$ | $9.5 \times 10^3$ | $4.2 \times 10^3$ |
| Whole light transmittance (%) | 90.4 | 88.9 | 82.5 | 79.8 |
| Haze | 0.4 | 0.4 | 0.5 | 0.6 |
| Pencil hardness | 5H | 5H | 5H | 5H |
| Adhesiveness | class 0 | class 0 | class 0 | class 0 |

As will be noted from the results, those having better conductivity are obtained by increasing the carbon nanotube coating amount. In the carbon nanotube used in Experiments 1 to 5, a surface resistivity on a level of $10^4$ (Ω/square) at most can be attained by adjusting the coating amount to $9 \times 10^{-3}$ (g/m$^2$) or more. However, when the carbon nanotube coating amount is increased too much, the transparency of the conductor decreases.

EXAMPLE 3

Comparison in Drying Temperature in Carbon Nanotube Network Formation:

Objective substrates of acryl plate having a carbon nanotube-containing resin coating layer were produced according to the same operation method as in Example 1, except that the drying temperature of 130° C. and the drying time of 1 minute after the bar coater coating with the aqueous solution for carbon nanotube network formation in (1) of Example 1 were changed as shown in Table 4.

Table 4 also shows the physical data of these objective substrates which were evaluated in the same manner as in Example 1.

TABLE 4

|  | Experiment 6 | Experiment 7 | Experiment 8 | Experiment 9 | Experiment 10 |
| --- | --- | --- | --- | --- | --- |
| Drying temperature (° C.) | 110 | 120 | 150 | 60 | 30 |
| Drying time (min) | 1 min | 1 min | 1 min | 3 min | 1 min |
| Surface resistivity (Ω/square) | $2.3 \times 10^4$ | $2.5 \times 10^4$ | $2.7 \times 10^4$ | $2.6 \times 10^4$ | * |
| Whole light transmittance (%) | 87.6 | 87.6 | 87.3 | 87.5 | * |
| Haze | 0.4 | 0.4 | 0.4 | 0.4 | * |
| Pencil hardness | 5H | 5H | 5H | 5H | * |
| Adhesiveness | class 0 | class 0 | class 0 | class 0 | * |

* Under the condition of 30° C. × 1 minute (Experiment 10), water could not completely evaporate after the coating, and in the subsequent water-washing step, the carbon nanotube-containing resin coating layer broke off from the release substrate. As the result, a sample suitable to practical use could not be obtained.

From the results, the release substrate after coating with the dispersion for carbon nanotube layer formation need to be dried at 100 to 150° C. for about 1 minute, or at 60 to 100° C. for 2 to 3 minutes. When the drying is insufficient, the adhesion of the carbon nanotube-containing resin coating layer to the release substrate becomes insufficient. As a result, the carbon nanotube-containing resin coating layer peeled in the next water-washing step, and a sample capable of being processed in the subsequent steps could not be obtained.

EXAMPLE 4

Comparison in Washing Time for Carbon Nanotube Network Layer:

Objective substrates having a carbon nanotube-containing resin coating layer were produced according to the same operation method as in Example 1, except that the immersion time of the carbon nanotube network layer in water, 5 minutes in (1) of Example 1 was changed as in Table 5.

Table 5 also shows the physical data of these objective substrates which were evaluated in the same manner as in Example 1.

In Table 6, the UV-curable resins other than those used in Example 1 are as follows:
EBECRYL 8804:

TABLE 5

|  | Experiment 11 | Experiment 12 | Experiment 13 | Experiment 14 | Experiment 15 |
|---|---|---|---|---|---|
| Time of immersion in water | 5 sec | 30 sec | 1 min | 30 min | 60 min |
| Surface resistivity (Ω/square) | $1.2 \times 10^5$ | $4.3 \times 10^4$ | $2.3 \times 10^4$ | $2.5 \times 10^4$ | $2.3 \times 10^4$ |
| Whole light transmittance (%) | 87.5 | 87.3 | 87.2 | 87.4 | 87.3 |
| Haze | 0.7 | 0.4 | 0.4 | 0.4 | 0.4 |
| Pencil hardness | 5H | 5H | 5H | 5H | 5H |
| Adhesiveness | class 0 | class 0 | class 0 | class 0 | class 0 |

The results show that a conductor having good conductivity and transparency can be obtained, when in preparing a release substrate, a substrate having a carbon nanotube layer is immersed in water or in a solvent such as alcohol which has the ability of dissolving the remaining dispersant and leveling agent without affecting adversely the release substrate and the carbon nanotube layer for a predetermined period of time, to thereby remove the dispersing agent, the leveling agent and other additives remaining in the carbon nanotube layer. In addition, regarding the immersion time in water, the surface resistivity change in the above-mentioned test results shows that the carbon nanotube network layer can be washed within an very short period of time of from tens seconds to a few minutes because the carbon nanotube network layer is an extremely thin film. Washing for a few minutes or so is preferred for reinforcing the washing effect.

urethane acrylate, number of acryloyl groups in one molecule: 2, weight-average molecular weight: 1300, produced by Daicel Cytec.

ArtResin UN-3320HC:
urethane acrylate, number of acryloyl groups in one molecule: 6, weight-average molecular weight: 1500, produced by Negami Chemical Industrial.

ArtResin UN-3320HA:
urethane acrylate, number of acryloyl groups in one molecule: 15, weight-average molecular weight: 5000, produced by Negami Chemical Industrial.

EBECRYL 1360:
silicone acrylate, number of acryloyl groups in one molecule: 6, weight-average molecular weight: 1300, produced by Daicel Cytec.

As will be noted from the result, the substrate with a monofunctional UV-curable resin used alone was unsatisfactory due to lack of sufficient curability for good transfer.

EXAMPLE 5

Comparison in the Type of UV-curable Resin Composition:

Objective substrates having a carbon nanotube-containing resin coating layer were produced according to the same operation method as in Example 1, except that the formulation of the UV-curable resin composition and the resin ingredients in (2) of Example 1 were changed as in Table 6.

Table 6 also shows the physical data of these objective substrates which were evaluated in the same manner as in Example 1.

EXAMPLE 6

Comparison in the Viscosity of UV-Curable Resin Composition:

Objective substrates having a carbon nanotube-containing resin coating layer were produced according to the same operation method as in Example 1, except that the formulation of the UV-curable resin composition in (2) of Example 1 was changed as in Table 7.

Table 7 also shows the physical data of these objective substrates which were evaluated in the same manner as in Example 1.

TABLE 6

|  | Experiment 1 | Experiment 16 | Experiment 17 | Experiment 18 | Experiment 19 | Experiment 20 |
|---|---|---|---|---|---|---|
| Beamset 577 | 46.00 pts. |  |  |  |  |  |
| EBECRYL 8804 |  |  | 46.00 pts. |  |  |  |
| ArtResin UN-3321HC |  |  |  | 46.00 pts. |  |  |
| ArtResin UN-3321HA |  |  |  |  | 46.00 pts. | 40.00 pts. |
| EBECRYL 114 | 20.00 pts. | 66.00 pts. | 20.00 pts. | 20.00 pts. | 20.00 pts. | 20.00 pts. |
| EBECRYL 1360 |  |  |  |  |  | 6.00 pts. |
| Irgacure 754 | 5.00 pts. | 5.00 pts. | 5.00 pts. | 5.00 pts. | 5.00 pts. | 5.00 pts. |
| Ethyl acetate | 29.00 pts. | 29.00 pts. | 29.00 pts. | 29.00 pts. | 29.00 pts. | 29.00 pts. |
| Total | 100.00 pts. | 100.00 pts. | 100.00 pts. | 100.00 pts. | 100.00 pts. | 100.00 pts. |
| Wet film thickness (μm) |  |  |  |  |  |  |
| Surface resistivity (Ω/square) | $2.3 \times 10^4$ | — | $1.2 \times 10^5$ | $4.6 \times 10^4$ | $5.4 \times 10^4$ | $4.3 \times 10^4$ |
| Whole light transmittance (%) | 87.4 | — | 87.0 | 87.5 | 87.6 | 87.0 |
| Haze | 0.4 | — | 0.4 | 0.3 | 0.7 | 0.3 |
| Pencil hardness | 5H | — | H | 4H | 5H | 5H |
| Adhesiveness | class 0 | — | class 0 | class 0 | class 0 | class 0 |
| Condition of costing film after transfer | ○ | *1) | ○ | ○ | ○ | ○ |

*1) The UV-curable resin composition could not cure through irradiation with UV rays, and good transfer could not be attained.

TABLE 7

|  | Experiment 21 | Experiment 22 | Experiment 23 | Experiment 24 | Experiment 25 |
|---|---|---|---|---|---|
| Beamset 577 | 46.5 pts. | 41.5 pts. | 65.0 pts. | 54.0 pts. | 32.5 pts. |
| Beamset 550B | 46.5 pts. | 41.5 pts. | — | — | — |
| EBECRYL 114 | — | 10.0 pts. | 28.0 pts. | 23.0 pts. | 14.0 pts. |
| Irgacure 754 | 7.0 pts. | 7.0 pts. | 7.0 pts. | 6.0 pts. | 3.5 pts. |
| Ethyl acetate | — | — | — | 17.0 pts. | 50.0 pts. |
| Total | 100.00 pts. | 100.00 pts. | 100.00 pts. | 100.00 pts. | 100.00 pts. |
| Viscosity (mPa·s) | 10550 | 4120 | 169 | 24 | 3 |
| Surface resistivity (Ω/square) | $3.2 \times 10^4$ | $3.0 \times 10^4$ | $2.6 \times 10^4$ | $2.8 \times 10^4$ | $2.5 \times 10^5$ |
| Whole light transmittance (%) | 87.4 | 87.6 | 87.5 | 87.3 | 87.7 |
| Haze | 0.4 | 0.4 | 0.4 | 0.4 | 0.4 |

These results show that even when the viscosity of the UV-curable resin composition to be pressed to contain the carbon nanotube layer is varied over a considerably wide range, the properties including conductivity and transparency of the obtained conductor is little affected.

EXAMPLE 7

Comparison in Load in Compression:

Objective substrates having a carbon nanotube-containing resin coating layer were produced according to the same operation method as in Example 1, except that the pressure (load) in compression between the carbon nanotube network layer and the UV-curable resin composition in (3) of Example 1 was changed as in Table 8.

Table 8 also shows the physical data of these objective substrates which were evaluated in the same manner as in Example 1.

TABLE 8

|  | Experiment 26 | Experiment 27 | Experiment 28 | Experiment 29 | Experiment 30 | Experiment 31 |
|---|---|---|---|---|---|---|
| Load in compression (g) | 100 | 200 | 300 | 500 | 1000 | 2000 |
| Surface resistivity (Ω/square) | $4.5 \times 10^4$ | $3.0 \times 10^4$ | $2.5 \times 10^4$ | $2.7 \times 10^4$ | $2.6 \times 10^4$ | $2.6 \times 10^4$ |
| Whole light transmittance (%) | 86.9 | 87.3 | 87.5 | 87.6 | 87.8 | 87.7 |
| Haze | 2.7 | 0.7 | 0.5 | 0.5 | 0.4 | 0.4 |
| Condition of coating film after transfer | x | x | ○ | ○ | ○ | ○ |

From the results, it is preferred that the carbon nanotube layer is adhered to the UV-curable resin composition by compression under a load of at least 300 g. Under a load lower than 300 g, an objective substrate having a good carbon nanotube-containing resin coating layer could not be obtained, because the carbon nanotube layer could not be sufficiently infiltrated with the UV-curable resin composition and the coating film after transfer has defects.

EXAMPLE 8

Doping Treatment:

The acryl plate having a carbon nanotube-containing resin coating layer obtained in Example 1 was immersed in various types of dopants for carbon nanotubes as shown in Table 9, for 10 minutes, and then the excessive dopant was removed by washing with water. Next, water still adhering to the plate was wiped off, and then the plate was dried at 110° C. for 1 minute to obtain an objective substrate of acryl plate having a doped carbon nanotube-containing resin coating layer.

Table 9 also shows the physical data of these objective substrates which were evaluated in the same manner as in Example 1.

TABLE 9

|  | Experiment 32 | Experiment 33 | Experiment 34 |
|---|---|---|---|
| Dopant | 6 N nitric acid | 6 N hydrochloric acid | aqueous 30% hydrogen peroxide |
| Surface resistivity (Ω/square) | $3.6 \times 10^3$ | $9.0 \times 10^3$ | $9.1 \times 10^3$ |
| Whole light transmittance (%) | 87.4 | 87.7 | 87.7 |
| Haze | 0.4 | 0.4 | 0.4 |

The results show that immersion of the carbon nanotube-containing resin coating layer in a dopant solution after curing of the resin with electron beams lowered the surface resistivity and greatly increased the conductivity without detracting from the transparency, since the carbon nanotube layer exists near the surface of the carbon nanotube-containing resin coating layer.

EXAMPLE 9

Comparison in Doping Treatment Time:

Objective substrates of acryl plate having a doped carbon nanotube-containing resin coating layer were produced according to the same operation method as in Experiment 32 of Example 8, except that the time of immersion in the dopant was changed as shown in Table 10.

Table 10 also shows the physical data of these objective substrates which were evaluated in the same manner as in Example 1.

TABLE 10

|  | Experiment 35 | Experiment 36 | Experiment 37 | Experiment 38 | Experiment 39 | Experiment 40 |
|---|---|---|---|---|---|---|
| Immersion time | 10 sec | 30 sec | 1 min | 3 min | 5 min | 30 min |
| Surface resistivity (Ω/square) | $1.9 \times 10^4$ | $1.4 \times 10^4$ | $9.0 \times 10^3$ | $4.4 \times 10^3$ | $3.5 \times 10^3$ | $3.5 \times 10^3$ |
| Whole light transmittance (%) | 87.5 | 87.6 | 87.6 | 87.9 | 87.5 | 87.7 |
| Haze | 0.4 | 0.4 | 0.4 | 0.4 | 0.5 | 0.4 |
| Pencil hardness | 5H | 5H | 5H | 5H | 5H | 5H |
| Adhesiveness | class 0 | class 0 | class 0 | class 0 | class 0 | class 0 |

The results show that immersion of the carbon nanotube-containing resin coating layer in a dopant solution after curing of the resin with electron beams significantly lowered the surface resistivity in spite of the immersion for short time, from 3 to 5 minutes, since the carbon nanotube layer exists near the surface of the carbon nanotube-containing resin coating layer.

EXAMPLE 10

Case of Using Multi-Walled Carbon Nanotubes:
(1) Formation of Release Substrate Having Carbon Nanonetwork Layer:

0.06 parts of NC 7000 (mean diameter: 10 nm, aspect ratio: 100 to 1000, produced by Nanocyl) as multi-walled carbon nanotubes and 0.12 parts of naphthalenesulfonic acid/formalin condensate sodium salt (trade name: Demol N, produced by Kao) as a dispersant were added to 99.82 parts of water. The mixture was dispersed using an ultrasonic disperser (UH600, produced by SMT) set at an output power of 7, at a cooling water temperature of 10° C. The time of the dispersion treatment was 30 minutes when the mixture amount was 100 g. Next, 0.50 parts of polyether-modified polydimethylsiloxane (trade name: BYK348,produced by BYK Chemie) as a leveling agent was added to the ultrasonicated dispersion with stirring to prepare an aqueous dispersion for carbon nanotube network layer formation.

Subsequently, the aqueous dispersion for carbon nanotube network formation was applied onto a release substrate, UV-transmissive untreated PET film (produced by Toyobo) using a bar coater, so that the coating amount of the carbon nanotubes thereon could be $6.9 \times 10^{-3}$ g/m$^2$, and then dried at 130° C. for 1 minute, thereby forming a carbon nanotube network layer on the release substrate. Next, this was immersed in water for 5 minutes to remove Demol N and BYK 348 remaining in the carbon nanotube network layer, then pulled up from water and left at room temperature for 5 minutes to darin off the water, and then further dried at 130° C. for 1 minute to obtain a release substrate, PET film having a carbon nanotube network layer on the surface thereof. The release substrate having a carbon nanotube network layer on the surface thereof was left in a thermo-hygrostat at a temperature of 20° C. and a humidity of 50% for 30 minutes.
(2) Preparation of Objective Substrate Having UV-curable Resin Composition:

46.00 parts of Beamset 577 and 20.00 parts of EBECRYL 114, the same UV-curable resins as in Example 1, were stirred and mixed, and 5.00 parts of IRGACURE 754 as a photopolymerization initiator was added thereto, followed by 29.00 parts of ethyl acetate, and then stirred and mixed until evenly combined, thereby giving a UV-curable resin composition. The UV-curable resin composition in a hermetically sealed state was stored in a thermo-hygrostat, in which the liquid temperature was controlled to be 20° C.

Subsequently, the UV-curable resin composition was applied onto an objective substrate, transparent acryl plate (whole light transmittance: 92.5%, produced by Kuraray) using a bar coater, to have a wet thickness of 60 μm thereon, thereby giving an acryl plate having a UV-curable resin composition layer.
(3) Formation of Objective Substrate Having Carbon Nanotube-Containing Resin Coating Layer:

One end of the carbon nanotube network layer formed on the surface of the release substrate as prepared in the above (1) was placed in contact with the UV-curable resin composition layer of the objective substrate of acryl plate as prepared in the above (2). At the contact portion, a paddle was pressed against the surface (uncoated surface) of the release substrate opposite to the PET film having the carbon nanotube network layer under a load of about 1000 g, and moved to the other end of the opposite side under the load to avoid making air bubbles in the contact area between the carbon nanotube network layer and the UV-curable resin composition layer as much as possible, thereby the UV-curable resin composition was infiltrated into the carbon nanotube network layer under pressure.

Subsequently, UV irradiation was conducted onto the PET film surface of the release substrate at the cumulative UV dose of 300 mJ/cm$^2$ using a UV exposure machine (ECS-151U, produced by Eye Graphics) to cure the UV-curable liquid resin composition. In this way, the carbon nanotube network layer was transferred and fixed in the UV-curable resin composition on the objective substrate, and thereafter the release PET film was peeled away.

Further, after removal of the PET film of release substrate, UV irradiation was conducted onto the surface of the carbon nanotube-containing resin layer of the objective substrate at the cumulative UV dose of 300 mJ/cm$^2$ using the same UV exposure machine as above, to obtain the objective substrate having a carbon nanotube-containing resin coating layer.

Table 11 shows the physical data of the thus obtained objective substrate and that after rub resistance test. Before coated with the resin, the acryl plate had a whole light transmittance of 92.5%, a haze of 0.1 and a pencil hardness of 3H.

TABLE 11

| | Evaluation Result in Experiment 41 | |
|---|---|---|
| Evaluation Item | Before rub resistance test | After rub resistance test |
| Type of CNT | Multi-walled CNT | Multi-walled CNT |
| CNT coating amount (g/m$^2$) | $6.9 \times 10^{-3}$ | $6.9 \times 10^{-3}$ |
| Surface resistivity (Ω/square) | $1.2 \times 10^5$ | $7.1 \times 10^5$ |
| Whole light transmittance (%) | 87.7 | 87.8 |
| Haze | 0.3 | 0.4 |
| Pencil hardness | 5H | 5H |
| Appearance of coating film | ○ | ○ |

As will be noted from the results, the conductor having multi-walled carbon nanotubes produced according to the method of the present invention, has good conductivity in its own way though its conductivity is somewhat inferior to that of the conductor having single-walled carbon nanotubes, and has excellent properties including transparency and strength. In addition, after the rub resistance test, the conductivity and the transparency did not lower significantly, the outward appearance of the coating film remained in good condition, and the durability of the conductor was excellent.

EXAMPLE 11

Case of IPA Dispersion of Carbon Nanotubes:
(1) Formation of Release Substrate Having Carbon Network Layer:

0.06 parts of NC 7000 (produced by Nanocyl) as multi-walled carbon nanotubes and 0.60 parts of Disper BYK 2050 (produced by BYK Chemie) as a dispersant were added to 99.34 parts of isopropyl alcohol. The mixture was dispersed using an ultrasonic disperser (UH600, produced by SMT) set at an output power of 7, at a cooling water temperature of 10° C. The time of the dispersion treatment was about 20 minutes when the mixture amount was 100 g. Next, the ultrasonicated dispersion was centrifuged using a centrifuge (H-200E, produced by Kokusan) under 800×g for 5 minutes to settle out the coarse particles that could not be dispersed finely, thereby separating the supernatant of an isopropyl alcohol dispersion for carbon nanotube network layer formation.

Subsequently, the isopropyl alcohol dispersion for carbon nanotube network formation was applied onto a release substrate, UV-transmissive untreated PET film (produced by Toyobo) using a bar coater so that the coating amount of the carbon nanotubes thereon could be $6.9 \times 10^{-3}$ g/m$^2$, and then dried at 130° C. for 1 minute to remove isopropyl alcohol by evaporation, thereby forming a carbon nanotube network layer on the release substrate. Next, this was immersed in isopropyl alcohol for 5 minutes to remove Disper BYK 2050 remaining in the carbon nanotube network layer, then pulled up from isopropyl alcohol and left at room temperature for 5 minutes, and then further dried at 130° C. for 1 minute to obtain a PET film having a carbon nanotube network layer on the surface thereof. This was left in a thermo-hygrostat at a temperature of 20° C. and a humidity of 50% for 30 minutes, thereby giving a release substrate of PET film having a carbon nanotube network layer on the surface thereof.
(2) Preparation of Objective Substrate Having UV-Curable Resin Composition:

46.00 parts of urethane acrylate resin (trade name: Beamset 577, produced by Arakawa Chemical Industries, number of acryloyl groups in one molecule: 3 to 6, weight-average molecular weight: 1000) as a UV-curable resin and 20.00 parts of ethoxylated phenyl acrylate (trade name: EBECRYL 114, produced by Daicel Cytec, number of acryloyl groups in one molecule: 1) were stirred and mixed, and 5.00 parts of IRGACURE 754 (produced by Ciba Specialty Chemicals) as a photopolymerization initiator was added thereto, followed by 29.00 parts of ethyl acetate, and then stirred and mixed until evenly combined, thereby giving a UV-curable resin composition. The UV-curable resin composition in a hermetically sealed state was stored in a thermo-hygrostat, in which the liquid temperature was controlled to be 20° C.

Subsequently, the UV-curable resin composition was applied onto an objective substrate, transparent acryl plate (whole light transmittance: 92.5%, produced by Kuraray) using a bar coater, to have a wet thickness of 60 μm thereon, thereby giving an acryl plate having a UV-curable resin composition layer.
(3) Formation of Objective Substrate Having Carbon Nanotube-Containing Resin Coating Layer:

One end of the carbon nanotube network layer formed on the surface of the release substrate of PET film as prepared in the above (1) was placed in contact with the UV-curable liquid resin composition layer of the objective substrate of acryl plate as prepared in the above (2). At the contact portion, a paddle was pressed against the surface (uncoated surface) of the release substrate opposite to the PET film having the carbon nanotube network layer under a load of about 1000 g, and moved to the other end of the opposite side under the load to avoid making air bubbles in the contact area between the carbon nanotube network layer and the UV-curable resin composition layer as much as possible, thereby the UV-curable resin composition was infiltrated into the carbon nanotube network layer under pressure.

After the pressure infiltration, UV irradiation was conducted onto the PET film surface of the release substrate at the cumulative UV dose of 300 mJ/cm$^2$ using a UV exposure machine (ECS-151U, produced by Eye Graphics) to cure the UV-curable liquid resin composition. Subsequently, the PET film of release substrate was peeled away to obtain an objective substrate having a carbon nanotube-containing resin coating layer. Further, after removal of the PET film of release substrate, UV irradiation was conducted onto the surface of the carbon nanotube-containing resin layer of the objective substrate at the cumulative UV dose of 300 mJ/cm$^2$ using the same UV exposure machine as above, to obtain the objective substrate having a carbon nanotube-containing resin coating layer.

Table 12 shows the physical data of the thus obtained objective substrate. Before coated with the resin, the acryl plate had a whole light transmittance of 92.5%, a haze of 0.1 and a pencil hardness of 3H.

TABLE 12

| Evaluation Item | Experiment 42 |
| --- | --- |
| Type of CNT | Multi-walled CNT |
| CNT coating amount (g/m$^2$) | $6.9 \times 10^{-3}$ |
| Surface resistivity (Ω/square) | $2.3 \times 10^5$ |
| Whole light transmittance (%) | 87.5 |
| Haze | 0.4 |
| Pencil hardness | 5H |

As will be noted from the results, in producing a conductor having carbon nanotubes on the surface thereof according to the method of the present invention where a dispersion of carbon nanotubes is prepared using isopropyl alcohol in place of water, when isopropyl alcohol having the ability of dissolving the dispersant, leveling agent and others without affecting adversely the release substrate and the carbon nanotube network layer is used as the solvent for washing the carbon nanotube network layer, the obtained objective substrate has a carbon nanotube-containing resin coating layer comparable to that in the case of using water.

EXAMPLE 12

Case of Objective Substrate Having Multilayer Coating Film:
(1) Formation of Release Substrate Having Carbon Network Layer:

A release substrate of PET film having a carbon nanotube network layer on the surface thereof was formed using the same carbon nanotubes, dispersant and leveling agent as those in (1) of Example 1 and according to the same method as in (1) of Example 1.
(2) Preparation of Aqueous Resin Composition for Undercoating:

With stirring 100.00 parts of a polyester dispersion (trade name: Vylonal MD 1245, produced by Toyobo), 1.00 parts of butyl carbitol as a filming assistant was added thereto and stirred until evenly combined to obtain an aqueous resin composition for undercoating. The aqueous resin composition for undercoating in a hermetically sealed state was stored in a thermo-hygrostat, in which the liquid temperature was controlled to be 20° C.

(3) Preparation of Uv-Curable Resin Composition:

A UV-curable liquid resin composition was obtained using the same UV-curable resin, photopolymerization initiator and solvent as those in (2) of Example 1 and according to the same method as in (2) of Example 1.

(4) Preparation of Objective Substrate Having Uv-curable Resin Composition:

The aqueous resin composition for undercoating prepared in the above (2) was applied onto an objective substrate, untreated PET plate (thickness: 3 mm, produced by Sumitomo Bakelite) using a bar coater to have a wet thickness of 16 μm, and then dried at 110° C. for 1 minute. Next, the UV-curable resin composition prepared in the above (3) was applied to it using a bar coater to have a wet thickness of 41 μm, thereby giving an objective substrate of PET plate having an undercoat layer and a UV-curable resin composition layer.

(5) Formation of Objective Substrate Having Carbon Nanotube UV-curable Resin Layer:

One end of the carbon nanotube network layer formed on the surface of the release substrate of PET film as prepared in the above (1) was placed in contact with the UV-curable resin composition layer of PET plate having the undercoat layer and the UV-curable liquid resin composition layer as prepared in the above (4). At the contact portion, a paddle was pressed against the surface (uncoated surface) of the release substrate opposite to the PET film having the carbon nanotube network layer under a load of about 1000 g, and moved to the other end of the opposite side under the load to avoid making air bubbles in the contact area between the carbon nanotube network layer and the UV-curable resin composition layer as much as possible, thereby the UV-curable resin composition was infiltrated into the carbon nanotube network layer under pressure.

Subsequently, UV irradiation was conducted onto the PET film surface of the release substrate at the cumulative UV dose of 300 mJ/cm$^2$ using a UV exposure machine (ECS-151U, produced by Eye Graphics) to cure the UV-curable liquid resin composition. Then, the PET film of release substrate was peeled off to obtain an objective substrate having a carbon nanotube-containing resin coating layer.

Further, after removal of the PET film of release substrate, UV irradiation was conducted onto the surface of the carbon nanotube-containing resin layer of the objective substrate of PET plate at the cumulative UV dose of 300 mJ/cm$^2$ using the same UV exposure machine as above, to obtain the objective substrate of PET plate having a carbon nanotube-containing resin coating layer.

Table 13 shows the physical data of the thus obtained objective substrate. Before coated with the resin, the PET plate had a whole light transmittance of 89.0%, a haze of 0.2 and a pencil hardness of B.

TABLE 13

| Evaluation Item | Experiment 43 |
| --- | --- |
| Surface resistivity (Ω/square) | 4.2 × 10$^4$ |
| Whole light transmittance (%) | 86.0 |
| Haze | 0.7 |
| Pencil hardness | H |
| Adhesiveness | class 0 |

As will be noted from the results, even when using an objective substrate to which a UV-curable resin could not adhere firmly, it is possible to obtain an objective substrate having a carbon nanotube-containing resin layer which takes advantage of the properties of UV-curable resin and is excellent in adhesiveness, by providing an undercoat layer having good adhesiveness to both the objective substrate and the UV-curable resin between the two.

EXAMPLE 13

Case of Objective Substrate Using Polycarbonate:
(1) Formation of Release Substrate Having Carbon Nanonetwork Layer:

An aqueous dispersion for carbon nanotube network layer formation was prepared using multi-walled carbon nanotubes NC 7000 according to the same method under the same condition as in Example 10. Subsequently, the dispersion was applied onto a release substrate, UV-transmissive untreated PET film, and dried to obtain a release substrate of PET film having a carbon nanotube network layer on the surface thereof according to the same method under the same condition as in Example 10.

(2) Preparation of Objective Substrate Having UV-curable Resin Composition:

A UV-curable resin composition was prepared according to the same method under the same condition as in Example 10, except that ArtResin UN-3320A for polycarbonate was used in place of Beamset 577 as the UV-curable resin. Subsequently, the UV-curable resin composition was applied onto an objective substrate, transparent polycarbonate plate (whole light transmittance: 88.7%, produced by Takiron) using a bar coater to have a wet thickness of 60 μm, thereby giving a polycarbonate plate having a UV-curable resin composition layer.

(3) Formation of Objective Substrate Having Carbon Nanotube-containing Resin Coating Layer:

Next, on the polycarbonate plate having the UV-curable resin composition layer prepared in the above (2), the UV-curable resin composition was infiltrated into the carbon nanotube network layer under pressure according to the same method under the same condition as in Example 10.

Subsequently, also similarly, UV irradiation was conducted onto the PET film surface of the release substrate to cure the UV-curable resin composition, and then the release PET film was peeled away. Further, after removal of the PET film of release substrate, UV irradiation was conducted onto the surface of the carbon nanotube-containing resin layer of the objective substrate at the cumulative UV dose of 300 mJ/cm$^2$, to obtain the objective substrate having a carbon nanotube-containing resin coating layer.

Table 14 shows the physical data of the thus obtained objective substrate and that after rub resistance test. Before coated with the resin, the polycarbonate plate had a whole light transmittance of 88.7%, a haze of 0.2 and a pencil hardness of B.

TABLE 14

| | Evaluation Result in Experiment 44 | |
| --- | --- | --- |
| Evaluation Item | Before rub resistance test | After rub resistance test |
| Type of CNT | Multi-walled CNT | Multi-walled CNT |
| CNT coating amount (g/m$^2$) | 6.9 × 10$^{-3}$ | 6.9 × 10$^{-3}$ |
| Surface resistivity (Ω/square) | 5.3 × 10$^5$ | 2.2 × 10$^6$ |
| Whole light transmittance (%) | 84.3 | 84.4 |

TABLE 14-continued

Evaluation Result in Experiment 44

| Evaluation Item | Before rub resistance test | After rub resistance test |
|---|---|---|
| Haze | 0.4 | 0.5 |
| Pencil hardness | H | H |
| Appearance of coating film | ○ | ○ |

As will be noted from the results, the coating film formed on the polycarbonate substrate as objective substrate according to the method of the present invention has conductivity comparable to that of the coating film formed on an acryl substrate, and is excellent in hardness and durability.

Comparative Example 1

Case of Overcoating of UV-curable Resin on CNT Layer:
(1) Formation of Objective Substrate Having Carbon Nanonetwork Layer:

An acryl plate having a carbon nanotube network layer on the surface thereof was produced according to the same method as in (1) of Example 1 and using the same single-walled carbon nanotubes, dispersant and leveling agent as in Example (1) of Example 1, except that an acryl plate (produced by Kuraray) was used in place of the PET film and the coating amount of carbon nanotubes was changed to $11.5 \times 10^3$ g/m$^2$. Hereinafter, the thus-produced acryl plate having a carbon nanotube network layer on the surface thereof is used as the objective substrate to be given conductivity.

(2) Preparation of Uv-curable Resin Composition for Overcoating:

0.12 parts of Beamset 577 (produced by Arakawa Chemical Industries, urethane acrylate, number of acryloyl groups in one molecule: 3 to 6, weight-average molecular weight: 1000) as a UV-curable resin and 0.05 parts of EBECRYL 114 (produced by Daicel Cytec, ethoxylated phenyl acrylate, number of acryloyl groups in one molecule: 1) were stirred and mixed, and 0.10 parts of IRGACURE 754 (by Ciba Specialty Chemicals) as a photopolymerization initiator was added thereto, followed by 99.82 parts of ethyl acetate, and then stirred and mixed until evenly combined, thereby giving a UV-curable resin composition. The UV-curable resin composition in a hermetically sealed state was stored in a thermohygrostat, in which the liquid temperature was controlled to be 20° C.

(3) Overcoating of Carbon Nanotube-having Objective Substrate:

The UV-curable resin composition for overcoating as prepared in the above (2) was applied onto the objective substrate of acryl plate having a carbon nanotube network layer on the surface thereof as prepared in the above (1) using an applicator to have a wet thickness of 25 μm, and then dried at 110° C. for 1 minute. Next, UV irradiation was conducted at the cumulative UV dose of 600 mJ/cm$^2$ using a UV exposure machine (ECS-151U, produced by Eye Graphics) to cure the acryl plate having a carbon nanotube network layer which had been coated with a UV-curable resin composition. In this way, a conductor having a carbon nanotube-containing resin layer in which the carbon nanotube layer on the acryl plate was coated with a LTV-curable resin layer was produced.

Table 15 shows the physical data of the thus obtained conductor and that after rub resistance test. Before coated with the resin, the acryl plate had a whole light transmittance of 92.5%, a haze of 0.1 and a pencil hardness of 3H.

TABLE 15

Evaluation Result in Experiment 45

| Evaluation Item | Before rub resistance test | After rub resistance test |
|---|---|---|
| CNT coating amount (g/m$^2$) | $11.5 \times 10^{-3}$ | $11.5 \times 10^{-3}$ |
| Surface resistivity (Ω/square) | $2.5 \times 10^6$ | $4.9 \times 10^{11}$ |
| Whole light transmittance (%) | 87.7 | 91.5 |
| Haze | 1.0 | 5.8 |
| Pencil hardness | H | unmeasurable* |
| Appearance of coating film | ○ | x |

*After the rub resistance test, the coating film severely broke away, and the pencil hardness thereof could not be measured.

As will be noted from the results, in the carbon nanotube-containing conductor produced according to the conventional overcoating method, surface resistivity was large, conductivity was extremely low, haze was large, and in particular, pencil hardness was H suggesting that the strength could not be satisfactory, even when the coating amount of the carbon nanotubes therein was comparable to that in the method of the present invention. Further, after the rub resistance test, the surface resistivity further greatly increased since the carbon nanotube layer on the surface broke away; the haze increased, and the outward appearance of the coating film worsened.

Comparative Example 2

Case of Coating of Vinyl Chloride Resin-containing Carbon Nanotube Liquid Composition:

(1) Formation of Objective Substrate Having Carbon Nanonetwork Layer:

0.06 parts of NC 7000 (produced by Nanocyl) as multi-walled carbon nanotubes and 0.60 parts of Disper BYK 2150 (produced by BYK Chemie) as a dispersant were added to 97.44 parts of cyclohexanone, and the mixture was dispersed using an ultrasonic disperser (UH 600, produced by SMT) set at an output power of 7, at a cooling water temperature of 10° C. The time of the dispersion treatment was about 20 minutes when the mixture amount was 100 g. Next, 1.90 parts of vinyl chloride resin (trade name: Kanevilack L-EY, produced by Kaneka) was added to the ultrasonicated dispersion, and centrifuged using a centrifuge (H-200E, produced by Kokusan) under 800×5 g for 5 minutes to settle out the coarse particles that could not be dispersed finely, and thereby separating the supernatant of a carbon nanotube-containing coating material.

(2) Formation of Objective Substrate Having Carbon Nanotubes:

The carbon nanotube-containing coating material as prepared in the above (1) was applied onto an objective substrate, polycarbonate plate (whole light transmittance: 88.7%, produced by Takiron) using a bar coater so that the coating amount of the carbon nanotubes could be $6.6 \times 10^{-3}$ g/m$^2$, and then dried at 110° C. for 1 minute. Next, the plate was pressed at a temperature of 220° C. under a pressure of 30 kg/cm$^2$ to obtain a conductor having a carbon nanotube-containing resin layer.

Table 16 shows the physical data of the thus obtained conductor and that after rub resistance test. Before coated with the resin, the polycarbonate plate had a whole light transmittance of 88.7%, a haze of 0.2 and a pencil hardness of B.

TABLE 16

| Evaluation Item | Evaluation Result in Experiment 46 | |
|---|---|---|
| | Before rub resistance test | After rub resistance test |
| CNT coating amount (g/m$^2$) | $6.6 \times 10^{-3}$ | $6.6 \times 10^{-3}$ |
| Surface resistivity (Ω/square) | $4.1 \times 10^7$ | $7.5 \times 10^8$ |
| Whole light transmittance (%) | 84.5 | 84.6 |
| Haze | 3.6 | 4.0 |
| Pencil hardness | B | B |
| Appearance of coating film | ○ | ○ |

As will be noted from the results, in the carbon nanotube-containing conductor produced according to the conventional method of coating with a coating material prepared by mixing and dispersing carbon nanotubes, the durability after the rub resistance test was comparable to that in the present invention. However, the surface resistivity was large, the conductivity was noticeably poor, the haze was large, and in particular, the pencil hardness was B suggesting the strength could not be satisfactory, even when the coating amount of the carbon nanotubes therein was comparable to that in the present invention.

Industrial Applicability

According to the method of the present invention, a conductor and a conductive film having high conductivity and transparency as well as excellent strength and durability can be obtained. The conductor and the conductive film are widely utilized in flat panel displays such as liquid crystals and organic EL, and in display parts of other various electronic appliances. In particular, the conductor having the above-mentioned excellent properties are useful for those applications.

Description of Reference Numerals

Figure 1:
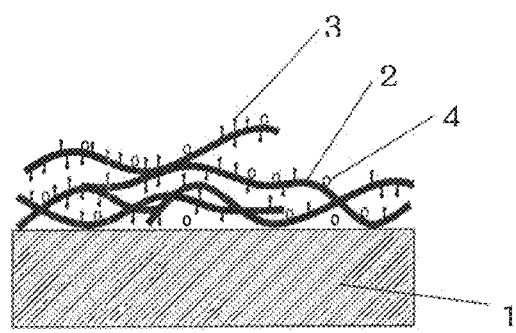
FIG. 1 is an explanatory view showing the condition where a carbon nanotube dispersion has been applied on a release substrate.
Figure 2:
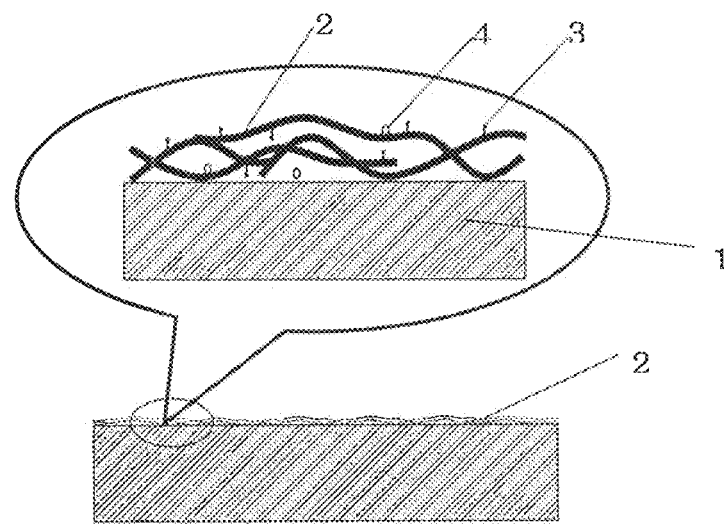
FIG. 2 is an explanatory view and a partially enlarged view showing the condition where a carbon nanotube network layer has been formed on the release substrate.
Figure 3:
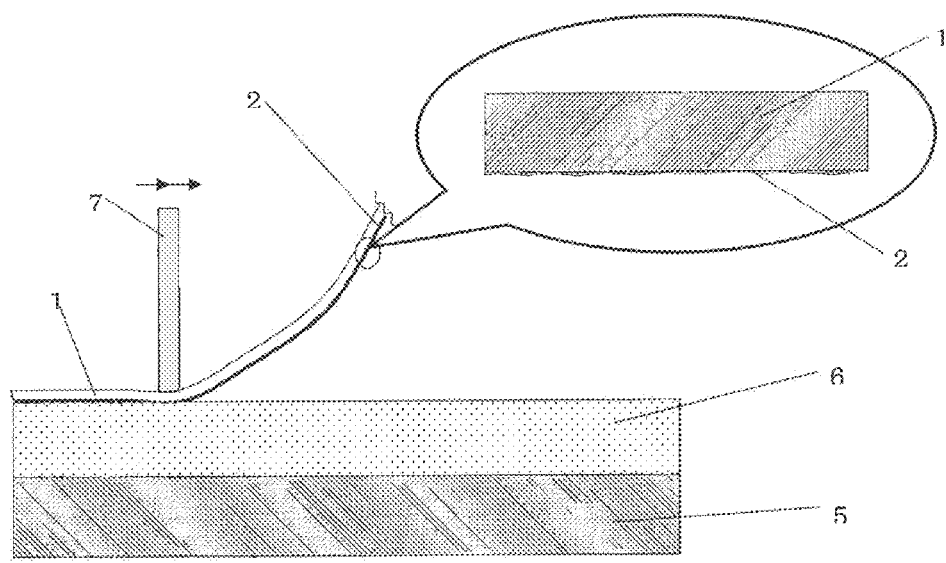
FIG. 3 is an explanatory view and a partially enlarged view showing the condition where the release substrate is pressed against an objective substrate coated with an electron beam-curable resin composition.
Figure 4:
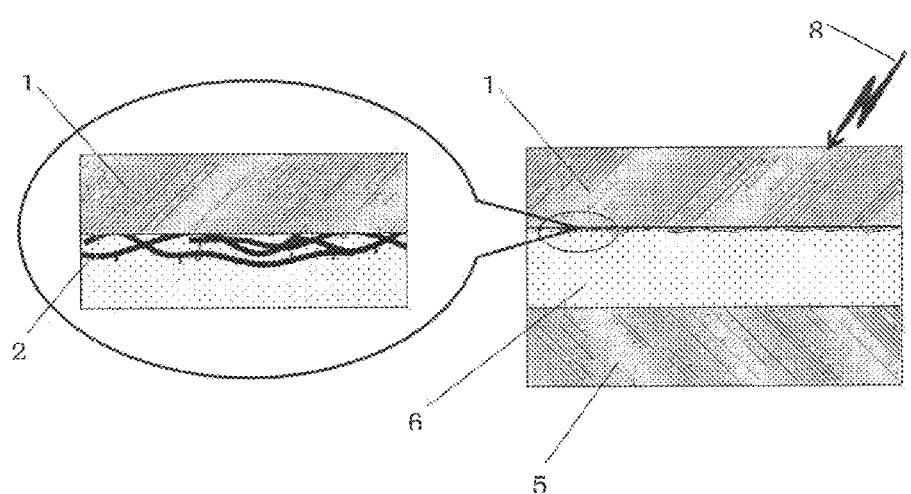
FIG. 4 is an explanatory view and a partially enlarged view showing the condition where the release substrate has been bonded under pressure to the objective substrate coated with an electron beam-curable resin composition.
Figure 5:
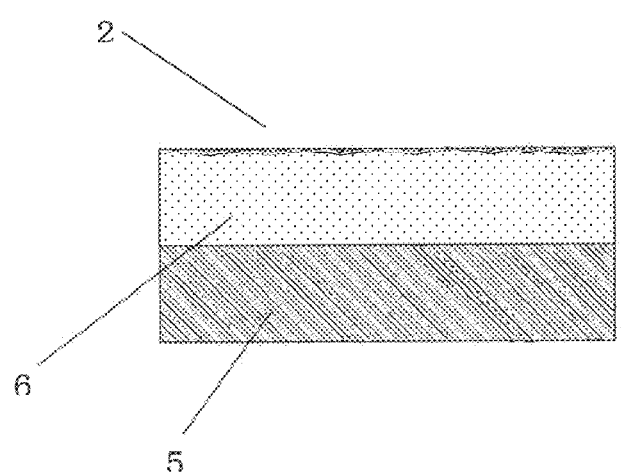
FIG. 5 is an explanatory view showing the objective substrate coated with an electron beam-curable resin composition, on the surface of which a carbon nanotube network layer has been formed and from which the release substrate has been removed.

1 Release Substrate
2 Carbon Nanotube
3 Dispersant
4 Leveling Agent
5 Objective Substrate
6 Electron Beam-Curable Resin Composition
7 Paddle
8 Electron Beam

The invention claimed is:

1. A method for producing a carbon nanotube-containing conductor that has a conductive layer on the surface of an objective substrate, comprising:
    pressing a carbon nanotube network layer, via a release substrate having the carbon nanotube network layer thereon, against a transparent objective substrate coated with an electron beam-curable liquid resin adhesive composition to infiltrate the liquid resin adhesive composition into the carbon nanotube network layer;
    irradiating the carbon nanotube network layer infiltrated with the electron beam-curable liquid resin adhesive composition with electron beams to cure the liquid resin adhesive composition; and
    peeling off the release substrate to obtain a conductor comprising the objective substrate having an adhesive resin composition layer with carbon nanotubes embedded in the surface thereof,
    wherein the carbon nanotubes are only present on and embedded in the surface of the electron beam-curable resin adhesive composition layer on the objective substrate, and wherein the carbon nanotubes of the carbon nanotube network layer are aggregates of a plurality of single fibers mutually entangled, and wherein, after the irradiation, the single fibers are discretely dispersed in the electron beam-curable resin.

2. The method for producing a carbon nanotube-containing conductor according to claim 1, wherein the release substrate having the carbon nanotube network layer is obtained by applying a dispersion that contains carbon nanotubes and a dispersion medium and optionally a dispersant, onto the surface of a release substrate and drying it thereon, to form a continuous three-dimensional network layer of carbon nanotubes on the surface thereof.

3. The method for producing a carbon nanotube-containing conductor according to claim 1, wherein the release substrate having the carbon nanotube network layer is obtained by applying a dispersion that contains carbon nanotubes and a dispersion medium and optionally a dispersant, onto the surface of a release substrate and drying it thereon, and then removing the remaining dispersant and other additives by washing with hot water or with the dispersion medium used in the dispersion of carbon nanotubes, to form a continuous three-dimensional network layer of carbon nanotubes on the surface thereof.

4. The method for producing a carbon nanotube-containing conductor according to claim 1, wherein the release substrate having the carbon nanotube network layer is obtained by applying a dispersion that contains carbon nanotubes and a dispersion medium and optionally a dispersant, onto the surface of a release substrate that is made of heat-resistant material and drying it thereon, and then removing the remaining dispersant and other additives through thermal decomposition at a temperature of from 400 to 600° C., to form a continuous three-dimensional network layer of carbon nanotubes on the surface thereof.

5. The method for producing a carbon nanotube-containing conductor according to claim 2, wherein the dispersion medium for carbon nanotubes is a polar solvent.

6. The method for producing a carbon nanotube-containing conductor according to claim 1, wherein the objective substrate with carbon nanotubes embedded in the surface of the electron beam-curable resin adhesive composition is washed with water and is further subjected to heating and drying treatment.

7. The method for producing a carbon nanotube-containing conductor according to claim 1, wherein the objective substrate with carbon nanotubes embedded in the surface of the electron beam-curable resin adhesive composition is subjected to impregnation treatment with a dopant, and then washed with water followed by heating and drying treatment.

8. The method for producing a carbon nanotube-containing conductor according to claim 1, wherein the electron beam-curable resin adhesive composition is a UV-curable resin adhesive composition.

9. The method for producing a carbon nanotube-containing conductor according to claim 8, wherein the UV-curable resin adhesive composition contains a resin having at least two acryloyl groups and a photopolymerization initiator.

10. The method for producing a carbon nanotube-containing conductor according to claim 9, wherein the resin having at least two acryloyl groups is a synthetic resin selected from urethane acrylates having at least two acryloyl groups.

11. The method for producing a carbon nanotube-containing conductor according to claim 2, wherein the dispersion containing carbon nanotubes is an aqueous dispersion.

12. The method for producing a carbon nanotube-containing conductor according to claim 7, wherein the impregnation treatment with a dopant is immersion in an aqueous solution of an inorganic acid and/or an organic acid or its salt.

* * * * *